US011183476B2

(12) United States Patent
Utsumi et al.

(10) Patent No.: US 11,183,476 B2
(45) Date of Patent: Nov. 23, 2021

(54) SILICON CARBIDE SEMICONDUCTOR DEVICE, SILICON CARBIDE SEMICONDUCTOR ASSEMBLY, AND METHOD OF MANUFACTURING SILICON CARBIDE SEMICONDUCTOR DEVICE

(71) Applicant: FUJI ELECTRIC CO., LTD., Kawasaki (JP)

(72) Inventors: Makoto Utsumi, Nagano (JP); Yoshiyuki Sakai, Nagano (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 46 days.

(21) Appl. No.: 16/585,699

(22) Filed: Sep. 27, 2019

(65) Prior Publication Data

US 2020/0152594 A1 May 14, 2020

(30) Foreign Application Priority Data

Nov. 9, 2018 (JP) .............................. JP2018-211827

(51) Int. Cl.
*H01L 29/16* (2006.01)
*H01L 23/00* (2006.01)
(Continued)

(52) U.S. Cl.
CPC .......... *H01L 24/29* (2013.01); *H01L 21/0485* (2013.01); *H01L 24/30* (2013.01);
(Continued)

(58) Field of Classification Search
CPC .......... H01L 24/30; H01L 2224/30505; H01L 2224/3003; H01L 24/83; H01L 24/32;
(Continued)

(56) References Cited

U.S. PATENT DOCUMENTS 7,687,023 B1 * 3/2010 Lee .......................... C22C 29/10
419/17
2004/0183080 A1 * 9/2004 Kusumoto ............ H01L 23/485
257/77
(Continued)

FOREIGN PATENT DOCUMENTS

| JP | 2010-62524 A | * | 3/2010 | ......... H01L 21/0485 |
| JP | 6099298 B2 | | 3/2017 | |
| JP | 6151089 B2 | | 6/2017 | |
| JP | 2017-120938 A | | 7/2017 | |

*Primary Examiner* — Shahed Ahmed
*Assistant Examiner* — Khatib A Rahman
(74) *Attorney, Agent, or Firm* — Rabin & Berdo, P.C.

(57) ABSTRACT

A silicon carbide semiconductor device including a semiconductor substrate containing silicon carbide, a contact electrode, which is a silicide layer containing nickel, provided on a surface of the semiconductor substrate and forming an ohmic contact with the semiconductor substrate, and a metal connection layer provided on a surface of the contact electrode. The metal connection layer has a stacked structure in which on the surface of the contact electrode, a titanium layer, a nickel layer, and a gold layer are sequentially stacked. The titanium layer includes a carbon diffusion layer formed along an interface between the titanium layer and the contact electrode, a concentration of carbon being higher in the carbon diffusion layer than in a portion of the titanium layer other than the carbon diffusion layer. The titanium layer, the nickel layer and the gold layer have thicknesses of 100 nm to 300 nm, 1000 nm to 1500 nm, and 20 nm to 200 nm, respectively.

12 Claims, 6 Drawing Sheets

(51) Int. Cl.
   *H01L 29/45* (2006.01)
   *H01L 21/04* (2006.01)
(52) U.S. Cl.
   CPC .............. *H01L 24/32* (2013.01); *H01L 29/45* (2013.01); *H01L 2224/29005* (2013.01); *H01L 2224/29144* (2013.01); *H01L 2224/29155* (2013.01); *H01L 2224/29166* (2013.01); *H01L 2224/29186* (2013.01); *H01L 2224/3003* (2013.01); *H01L 2224/30505* (2013.01); *H01L 2924/10272* (2013.01)

(58) Field of Classification Search
   CPC ........... H01L 2224/05583; H01L 29/45; H01L 21/0485; H01L 29/1608; H01L 2224/29155; H01L 2224/29166; H01L 2224/29144; H01L 24/29; H01L 2224/29186; H01L 2924/10272; H01L 2224/29005; H01L 2224/83192; H01L 2224/0345; H01L 2224/94; H01L 2924/13091; H01L 2924/13055; H01L 2224/04026; H01L 2224/06181; H01L 2224/32225; H01L 24/05; H01L 24/03; H01L 29/401; H01L 29/7395
   See application file for complete search history.

(56) References Cited

U.S. PATENT DOCUMENTS

| | | | | |
|---|---|---|---|---|
| 2006/0273323 | A1* | 12/2006 | Yamamoto | H01L 29/1608 257/77 |
| 2007/0138482 | A1* | 6/2007 | Tanimoto | H01L 29/66068 257/77 |
| 2010/0055858 | A1* | 3/2010 | Hayashi | H01L 29/7802 438/285 |
| 2010/0207125 | A1* | 8/2010 | Uchida | H01L 21/0485 257/77 |
| 2011/0031506 | A1* | 2/2011 | Tamaso | H01L 21/0485 257/77 |
| 2013/0017677 | A1* | 1/2013 | Horii | H01L 21/0485 438/586 |
| 2013/0062624 | A1* | 3/2013 | Tsuchiya | H01L 29/7806 257/77 |
| 2014/0061674 | A1* | 3/2014 | Imai | H01L 29/0619 257/77 |
| 2014/0346531 | A1* | 11/2014 | Imai | H01L 21/28518 257/77 |
| 2015/0001554 | A1* | 1/2015 | Imai | H01L 29/47 257/77 |
| 2015/0024581 | A1* | 1/2015 | Imai | H01L 21/28537 438/571 |
| 2016/0087061 | A1* | 3/2016 | Imai | H01L 21/0485 257/77 |
| 2020/0044031 | A1* | 2/2020 | Pham | H01L 21/02521 |

* cited by examiner

SILICON CARBIDE SEMICONDUCTOR DEVICE, SILICON CARBIDE SEMICONDUCTOR ASSEMBLY, AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-211827, filed on Nov. 9, 2018, the entire contents of which are incorporated herein by reference.

BACKGROUND OF THE INVENTION

1. Field of the Invention

Embodiments of the invention relate to a silicon carbide semiconductor device, a silicon carbide semiconductor assembly, and a method of manufacturing a silicon carbide semiconductor device.

2. Description of the Related Art

Conventionally, silicon carbide semiconductor devices are known to include, as a surface electrode, a contact electrode that forms an ohmic contact (electrical contact portion exhibiting linearity) with a semiconductor substrate containing silicon carbide (SiC) and a metal connection layer that connects the contact electrode and a solder layer. The contact electrode is a layer of nickel (Ni) or titanium (Ti) or a silicide layer containing both nickel and titanium. The metal connection layer has a stacked structure in which sequentially from nearest the semiconductor substrate, a titanium layer, a nickel layer, and a gold (Au) layer are stacked (for example, refer to Japanese Patent No. 6099298 (paragraphs 0040 to 0041, 0048, and FIG. 8), Japanese Laid-Open Patent Publication No. 2017-120938 (paragraphs 0029, 0031, and FIG. 5), and Japanese Patent No. 6151089 (paragraphs 0020 to 0026, and FIG. 9)).

Japanese Patent No. 6099298 discloses that during a heat treatment for forming a nickel silicide (NiSi) layer that forms an ohmic contact with the semiconductor substrate containing silicon carbide, a carbon atom concentration of a carbon layer deposited on a surface of the nickel silicide layer is set so that a carbon atom concentration of titanium carbide (TiC) contained in the nickel silicide layer is in a range from 12 to 30%. As a result, adhesion between the nickel silicide layer and the metal connection layer is enhanced. Further, Japanese Patent No. 6099298 discloses that the titanium layer, the nickel layer, and the gold layer forming the metal connection layer between the nickel silicide electrode and the solder layer have thicknesses of 70 nm, 700 nm, and 200 nm, respectively, before the metal connection layer is soldered to the base substrate.

Japanese Laid-Open Patent Publication No. 2017-120938 discloses that during a heat treatment for forming a nickel silicide (NiSi) layer that forms an ohmic contact with a semiconductor substrate that contains silicon carbide, a carbon layer that is deposited on a surface of the nickel silicide layer is removed. Thus, by removing the carbon layer deposited on the surface of the nickel silicide layer, adhesion between the semiconductor substrate and the nickel silicide layer, and adhesion between the nickel silicide layer and a metal connection layer are enhanced. Further, Japanese Laid-Open Patent Publication No. 2017-120938 discloses that a titanium layer, a nickel layer, and a gold film that form the metal connection layer between the nickel silicide electrode and a solder layer have thicknesses of 70 nm, 400 nm, and 200 nm, respectively, before the metal connection layer is soldered to the base substrate.

Japanese Patent No. 6151089 discloses that a rear electrode is formed by sequentially stacking on a surface of a semiconductor substrate containing silicon carbide, a nickel silicide layer, a titanium layer, and a nickel layer. It is additionally disclosed that in the rear electrode, the titanium layer has a thickness that is at most 1000 nm and the nickel layer has a thickness that is at most 7000 nm before the rear electrode is soldered to the base substrate. Japanese Patent No. 6151089 further discloses that when the titanium layer of the rear electrode forms an alloy with the nickel layer and the solder layer nickel layer across the entire nickel layer, the titanium layer functions as a barrier layer that prevents the solder layer from contacting the semiconductor substrate.

SUMMARY OF THE INVENTION

According to an embodiment of the invention, a silicon carbide semiconductor device includes a semiconductor substrate containing silicon carbide; a contact electrode that is a silicide layer containing nickel, the contact electrode being provided on a surface of the semiconductor substrate and forming an ohmic contact with the semiconductor substrate; and a metal connection layer provided on a surface of the contact electrode. The metal connection layer has a stacked structure in which on the surface of the contact electrode, a titanium layer, a nickel layer, and a gold layer are sequentially stacked. The titanium layer includes a carbon diffusion layer formed along an interface between the titanium layer and the contact electrode, a concentration of carbon being higher in the carbon diffusion layer than in a portion of the titanium layer other than the carbon diffusion layer. The titanium layer has a thickness that is in a range from 100 nm to 300 nm. The nickel layer has a thickness that is in a range from 1000 nm to 1500 nm, and the gold layer has a thickness that is in a range from 20 nm to 200 nm.

In the embodiment, the carbon diffusion layer contains at least 20 atomic-percent of carbon and covers the entire interface between the titanium layer and the contact electrode.

In the embodiment, the contact electrode is a nickel silicide layer that contains a carbide.

In the embodiment, the carbide is molybdenum carbide or titanium carbide.

According to another embodiment of the invention, a silicon carbide semiconductor assembly includes a silicon carbide semiconductor device, including a semiconductor substrate containing silicon carbide, a contact electrode that is a silicide layer containing nickel, the contact electrode being provided on a surface of the semiconductor substrate and forming an ohmic contact with the semiconductor substrate, and a metal connection layer provided on a surface of the contact electrode; and a base substrate on which the silicon carbide semiconductor device is mounted, the base substrate being in contact with the metal connection layer via a solder layer. The metal connection layer has a stacked structure in which on the surface of the contact electrode, a titanium layer, a nickel layer, and a gold layer are sequentially stacked. The titanium layer includes a carbon diffusion layer formed along an interface between the titanium layer and the contact electrode, a concentration of carbon being higher in the carbon diffusion layer than in a portion of the titanium layer other than the carbon diffusion layer. The titanium layer has a thickness that is in a range from 100 nm to 300 nm, and the nickel layer has a thickness that is at least 50 nm.

According to another embodiment of the invention, a method of manufacturing a silicon carbide semiconductor device includes providing a semiconductor substrate containing silicon carbide; forming, on a surface of the semiconductor substrate, a metal layer that contains nickel; forming a contact electrode in contact with the semiconductor substrate, by applying heat treatment to the semiconductor substrate and the metal layer, thereby causing silicon atoms in the semiconductor substrate and nickel atoms in the metal layer to react, so as to form a nickel silicide layer that is the contact electrode; and forming on a surface of the contact electrode, a metal connection layer of a stacked structure, by sequentially stacking a titanium layer, a nickel layer, and a gold layer on the surface of the contact electrode. The titanium layer has a thickness that is in a range from 100 nm to 300 nm. The nickel layer has a thickness that is in a range from 1000 nm to 1500 nm. The gold layer has a thickness that is in a range from 20 nm to 200 nm. The contact electrode has surplus carbon atoms, which are diffused from the contact electrode into the titanium layer to form, in the titanium layer along an interface between the titanium layer and the contact electrode, a carbon diffusion layer, a concentration of carbon being higher in the carbon diffusion layer than in a portion of the titanium layer other than the carbon diffusion layer.

In the embodiment, forming the metal layer includes: forming on the surface of the semiconductor substrate, a first metal layer containing a metal carbide, and forming on a surface of the first metal layer, a second metal layer containing nickel. In forming the nickel silicide layer, metal atoms in the first metal layer and carbon atoms in the semiconductor substrate react with each other to form a carbide, and the silicon atoms in the semiconductor substrate and nickel atoms in second metal layer react with each other to form the nickel silicide layer.

In the embodiment, the first metal layer contains molybdenum or titanium, and the nickel silicide layer contains molybdenum carbide or titanium carbide.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be discussed. In the silicon carbide semiconductor device described above, a titanium layer, a nickel layer, and a gold layer are sequentially stacked on the contact electrode, as the metal connection layer that connects the contact electrode and the solder layer. The titanium layer has a function of enhancing the adhesion between the contact electrode and the metal connection layer. The nickel layer has a function of enhancing the adhesion between the metal connection layer and the solder layer. When the metal connection layer is soldered to the base substrate, nickel atoms in the nickel layer and gold atoms in the gold layer diffuse to the solder layer, whereby the adhesion between the metal connection layer and the solder layer is enhanced.

However, diffusion of the nickel atoms in the nickel layer and diffusion of the gold atoms in the gold layer into the solder layer causes the nickel layer and the gold layer to disappear. In regions where the nickel layer and the gold layer disappear, the titanium layer and the solder layer contact each other, and titanium atoms in the titanium layer also diffuse into the solder layer. When the titanium layer also disappears, the contact electrode that is formed by a silicide layer having low adhesion with the solder layer is in contact with the solder layer in a region where the titanium layer disappears, whereby a problem arises in that the adhesion between the contact electrode and the solder layer decreases.

In Japanese Patent No. 6099298, Japanese Laid-Open Patent Publication No. 2017-120938, and Japanese Patent No. 6151089, desirable thicknesses of the metal layers of the metal connection layer having a 3-layer structure and connecting the contact electrode and the solder layer are not recited. Further, in Japanese Patent No. 6099298, Japanese Laid-Open Patent Publication No. 2017-120938, and Japanese Patent No. 6151089, regarding each metal layer of the metal connection layer having the 3-layer structure, for each of the metal layers forming the metal connection layer having the 3-layer structure, only a thickness before the metal connection layer is soldered to the base substrate is recited, and the thickness after the metal connection layer is soldered to the base substrate is not specified. Moreover, in Japanese Patent No. 6099298, Japanese Laid-Open Patent Publication No. 2017-120938, and Japanese Patent No. 6151089, how required thicknesses of the metal layers forming the metal connection layer having the 3-layer structure remain at the time of product completion after an assembly process is not recited.

Embodiments of a silicon carbide semiconductor device, a silicon carbide semiconductor assembly, and a method of manufacturing a silicon carbide semiconductor device according to the present invention will be described in detail with reference to the accompanying drawings. In the description of the embodiments below and the accompanying drawings, main portions that are identical will be given the same reference numerals and will not be repeatedly described.

Figure 1:
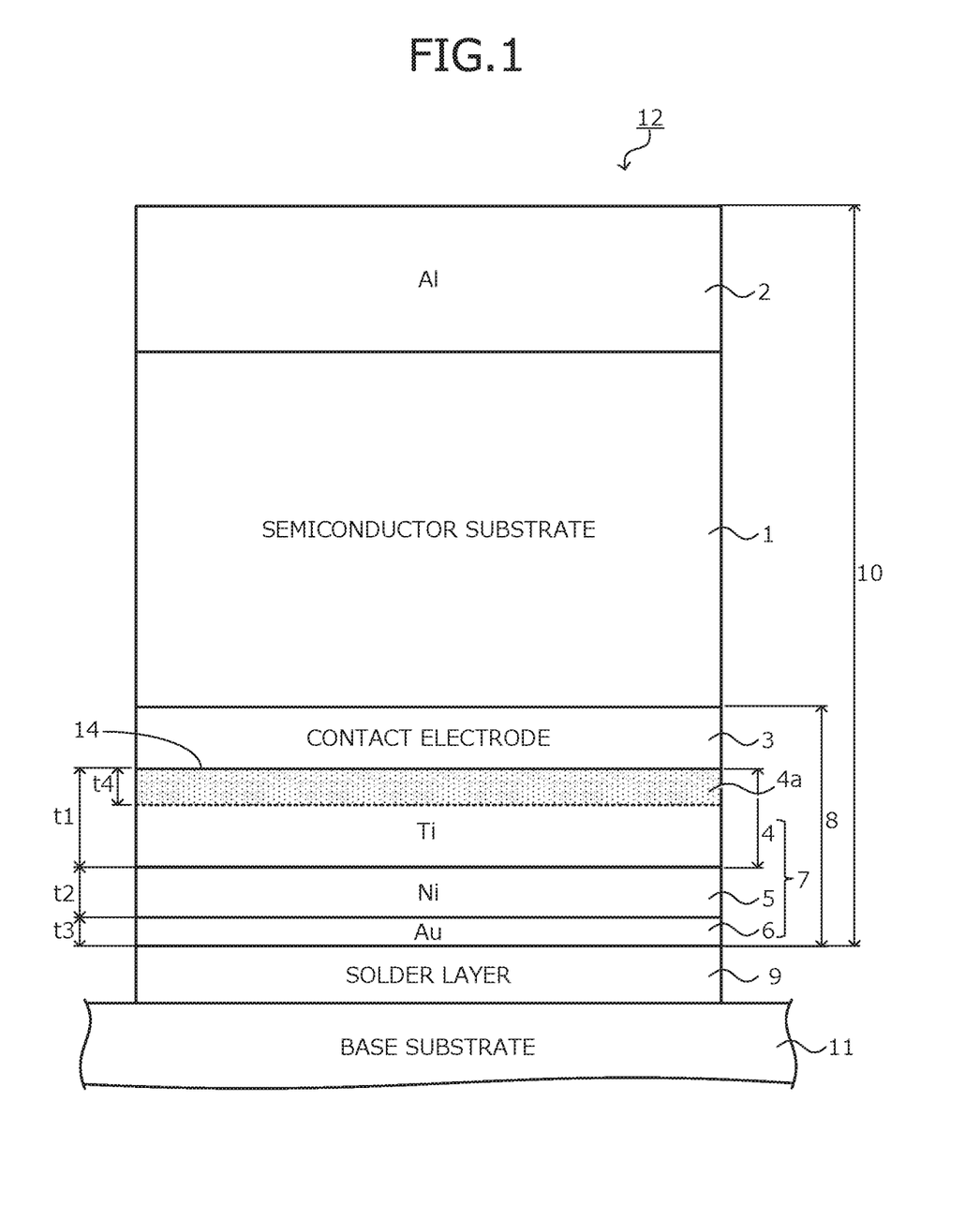
FIG. 1 is a cross-sectional view of a structure of the silicon carbide semiconductor assembly according to the embodiment.

A structure of a silicon carbide (SiC) semiconductor device and a silicon carbide semiconductor assembly according to an embodiment will be described. FIG. 1 is a cross-sectional view of a structure of the silicon carbide semiconductor assembly according to the embodiment. A silicon carbide semiconductor assembly 12 according to the embodiment and depicted in FIG. 1 is a product after an assembly process and is a package including a semiconductor substrate (semiconductor chip) 1 on which a silicon carbide semiconductor device 10 according to the embodiment is fabricated (manufactured) as a component mounted on a base substrate 11. The semiconductor substrate 1 is bonded and mounted to the base substrate 11 via a solder layer 9.

The silicon carbide semiconductor device 10 according to the embodiment includes, as a rear electrode 8 provided at a rear surface of the semiconductor substrate 1, a contact electrode 3 forming an ohmic contact (electrical contact portion exhibiting linearity) with the semiconductor substrate 1, and a metal connection layer 7 connecting the contact electrode 3 and the solder layer 9. The assembly process is a process of soldering the metal connection layer 7 to a conductive plate (not depicted) of the base substrate 11 and thereby, mounting the semiconductor substrate 1 to the base substrate 11. The conductive plate is a wiring layer formed by a predetermined pattern on the base substrate 11.

For example, a non-depicted predetermined element structure such as a metal oxide semiconductor field effect transistor (MOSFET), which is a MOS field effect transistor including an insulated gate having a 3-layer structure including a metal, an oxide film, and a semiconductor material; an insulated gate bipolar transistor (IGBT); a diode or the like is provided in the semiconductor substrate 1.

At a front surface of the semiconductor substrate 1, a front electrode 2 containing, for example, aluminum (Al) is provided. At the rear surface of the semiconductor substrate 1, sequentially from nearest the semiconductor substrate 1, the contact electrode 3 and the metal connection layer 7 are stacked as the rear electrode 8. The front electrode 2 and the contact electrode 3 are electrically connected to predetermined regions exposed at the front surface and the rear surface of the semiconductor substrate 1, respectively. For example, when the silicon carbide semiconductor device 10 according to the embodiment is a MOSFET, the front electrode 2 is a source electrode and the rear electrode 8 is a drain electrode.

The contact electrode 3 is a silicide layer that contains nickel (Ni) as a constituent element and that further contains as a constituent element, for example, molybdenum (Mo) or titanium (Ti) that easily generates a metal carbide by bonding with surplus carbon (C) atoms (hereinafter, surplus carbon atoms) occurring in the semiconductor substrate 1 during a heat treatment (process at step S6 described hereinafter) for forming a silicide that forms an ohmic contact between the semiconductor substrate 1 and the contact electrode 3. In particular, the contact electrode 3 is a nickel silicide (NiSi) layer that contains molybdenum carbide (MoC) or titanium carbide (TiC).

The metal connection layer 7 has a stacked structure in which sequentially from nearest the contact electrode 3, a titanium layer 4, a nickel layer 5, and a gold (Au) layer 6 are stacked. The titanium layer 4 has high adhesion with nickel atoms in the contact electrode 3 and has a function of enhancing adhesion between the contact electrode 3 and the metal connection layer 7. A thickness t1 of the titanium layer 4 is substantially equal to a thickness (hereinafter, initial thickness, refer to FIG. 6) t1' of the titanium layer 4 at a time of formation (at a time of a process at step S8 described hereinafter) of the titanium layer 4. The thickness t1 of the titanium layer 4 may be, for example, in a range from 100 nm to ensure reliability, to about 300 nm to suppress brittleness and destruction of the titanium layer 4.

A reason that the thickness t1 of the titanium layer 4 is maintained at a thickness substantially equal to the initial thickness t1' of the titanium layer 4 is as follows. In the assembly process, when the metal connection layer 7 is soldered to the conductive plate of the base substrate 11, nickel atoms in the nickel layer 5 and gold atoms in the gold layer 6 diffuse into the solder layer 9, whereby the nickel layer 5 and the gold layer 6 disappear. Even when the solder layer 9 and the titanium layer 4 are in contact with each other at regions where the nickel layer 5 and the gold layer 6 disappear and titanium atoms in the titanium layer 4 diffuse from these contact points toward the solder layer 9, diffusion of the titanium atoms from the titanium layer 4 to the solder layer 9 is stopped at a later-described carbon diffusion layer 4a (hatched portion) that is in the titanium layer 4 and contains carbon at a high concentration. Thus, there is substantially no decrease in a concentration of the titanium atoms in the titanium layer 4 after the assembly process.

In the titanium layer 4, the carbon diffusion layer 4a that contains carbon at a high concentration is provided toward an interface 14 between the titanium layer 4 and the contact electrode 3. The carbon diffusion layer 4a that contains carbon at a high concentration is formed by a diffusion of surplus carbon atoms that occur in the semiconductor substrate 1 during a heat treatment for forming a silicide that forms an ohmic contact between the semiconductor substrate 1 and the contact electrode 3, the surplus carbon atoms diffusing into the titanium layer 4 as a consequence of a history of heating in manufacturing processes. The carbon diffusion layer 4a that contains carbon at a high concentration is in contact with the contact electrode 3. The carbon diffusion layer 4a that contains carbon at a high concentration has a characteristic in that the carbon diffusion layer 4a does not easily melt in solder. The metal (molybdenum or titanium) in the contact electrode 3 may be included as a constituent element in the carbon diffusion layer 4a that contains carbon at a high concentration. Provided the carbon diffusion layer 4a that contains carbon at a high concentration faces the interface 14 between the titanium layer 4 and the contact electrode 3 overall, a thickness t4 of the carbon diffusion layer 4a that contains carbon at a high concentration may be non-uniform. The carbon diffusion layer 4a that contains carbon at a high concentration contains carbon at an atomic percentage of at least 20 percent and may contain carbon at an atomic percentage in a range from 40 percent to 50 percent.

The nickel layer 5 and the gold layer 6 form a molten layer to the solder layer 9 that is, for example, Sn.Ag (tin.silver) based and lead (Pb)-free. The gold layer 6 has a function of enhancing wettability of a solder applied to a surface of the metal connection layer 7. When the metal connection layer 7 is soldered to the conductive plate of the base substrate 11, nickel atoms in the nickel layer 5 and gold atoms in the gold layer 6 diffuse into the solder layer 9, whereby adhesion between the metal connection layer 7 and the solder layer 9 improves.

Respective thicknesses t2, t3 of the nickel layer 5 and the gold layer 6 are thinner than initial thicknesses t2', t3' thereof in the formation (processes at steps S9, S10 described hereinafter) of the nickel layer 5 and the gold layer 6. The thickness t2 of the nickel layer 5 may be, for example, at least 50 nm after the assembly process to ensure reliability. Due to a high cost of gold (Au), a material of the gold layer 6, the thickness t3 of the gold layer 6, for example, is determined according to cost.

Figure 2:
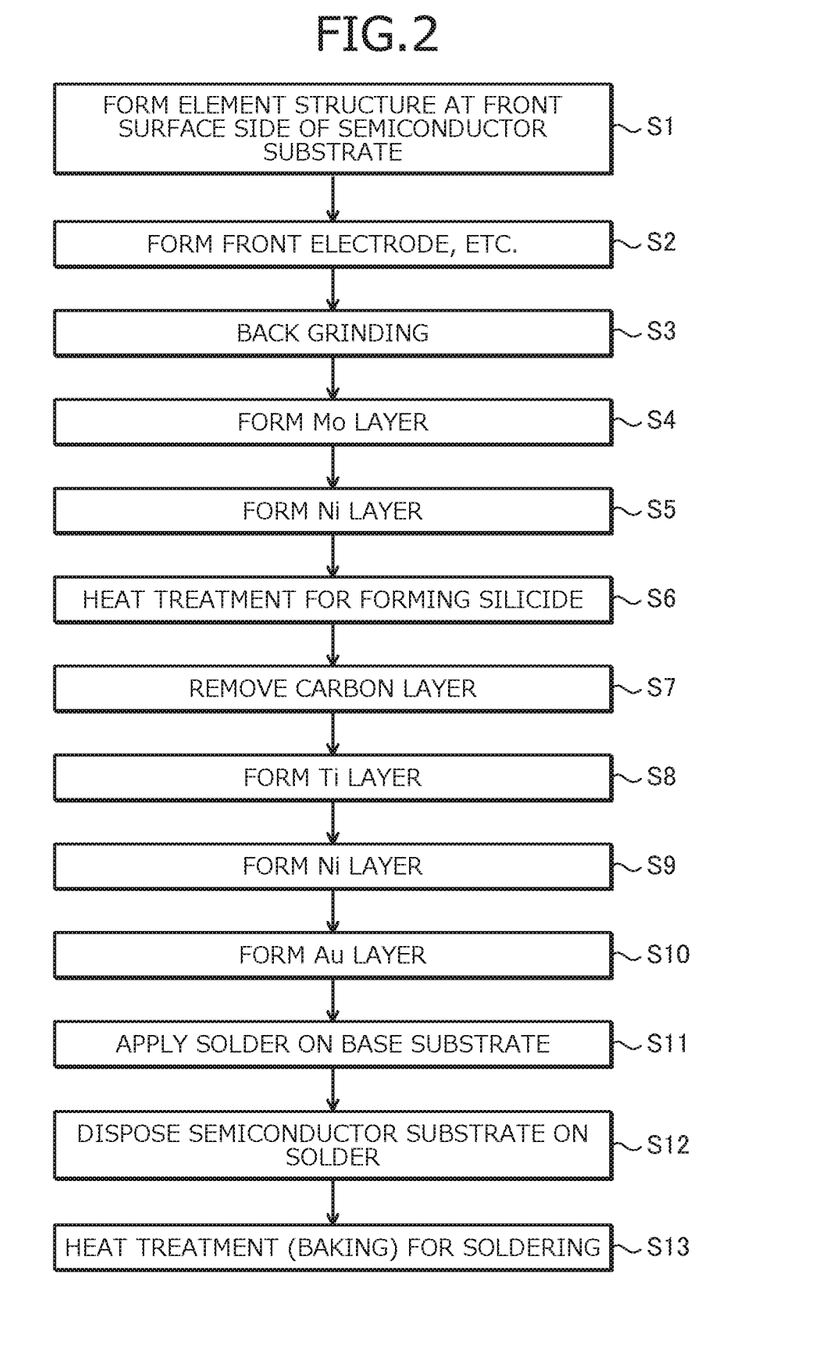
FIG. 2 is a flowchart depicting an outline of the method of manufacturing the silicon carbide semiconductor assembly according to the embodiment.

A method of manufacturing the silicon carbide semiconductor assembly 12 according to the embodiment will be described. FIG. 2 is a flowchart depicting an outline of the method of manufacturing the silicon carbide semiconductor assembly according to the embodiment. FIGS. 3, 4, 5, and 6 are cross-sectional views of the silicon carbide semiconductor device according to the embodiment during manufacture. First, an element structure is formed at a front surface side of the semiconductor substrate (semiconductor wafer) 1 that contains silicon carbide (step S1). This element structure is an element structure that of predetermined element structures formed in the semiconductor substrate 1, is formed at the front surface side of the semiconductor substrate 1.

The element structure of the front surface side of the semiconductor substrate includes a MOS gate structure and a diffusion region (not depicted) such as a source region or a base region, for example, when a MOSFET is fabricated (manufactured) as the silicon carbide semiconductor device 10 according to the embodiment. Next, the front electrode 2 (refer to FIG. 1), a passivation film (not depicted), etc. are formed at the front surface of the semiconductor substrate 1 (step S2). A heat treatment (curing) for enhancing the strength of the passivation film, for example, may be a heat treatment process performed at about 380 degrees C. in a nitrogen ($N_2$) atmosphere for about 60 minutes.

Next, the semiconductor substrate 1 is ground from a rear surface side thereof (hereinafter, back grinding), to an extent that a thickness for use of the silicon carbide semiconductor device 10 as a product is achieved (step S3). Next, a cleaning process for removing a natural oxide film formed at the rear surface of the semiconductor substrate 1 is performed. The cleaning process, for example, may be a process (hereinafter, dilute hydrofluoric acid treatment) of etching the rear surface of the semiconductor substrate 1 using a diluted hydrofluoric acid (HF) solution.

Figure 3:
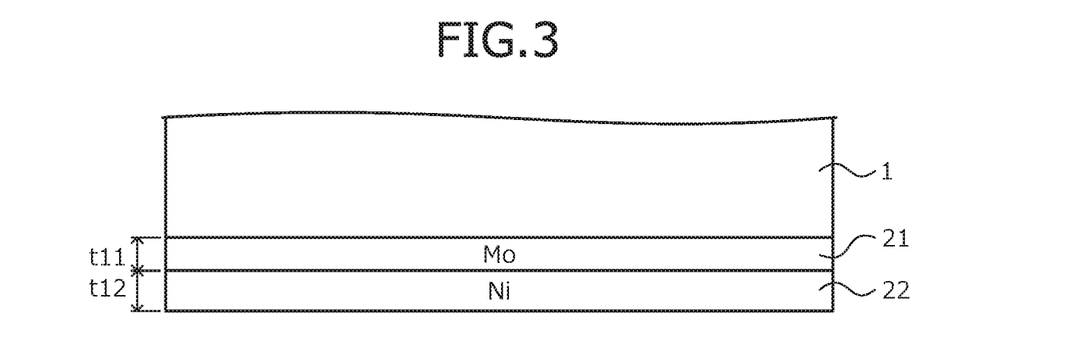
FIG. 3 is a cross-sectional view of the silicon carbide semiconductor device according to the embodiment during manufacture.

Next, as depicted in FIG. 3, for example, by sputtering, a molybdenum (Mo) layer (first metal layer) 21 and a nickel (Ni) layer (second metal layer) 22 are sequentially stacked (formed) at the ground rear surface of the semiconductor substrate 1 (steps S4, S5: first process). A thickness t11 of the molybdenum layer 21 may be, for example, in a range from about 30 nm to 80 nm. A thickness t12 of the nickel layer 22 may be, for example, in a range from about 80 nm to 120 nm. Instead of the molybdenum layer 21, a titanium layer may be formed.

On the semiconductor substrate 1, the molybdenum layer 21 and the nickel layer 22 may be stacked in the order stated. As compared to a case in which on the semiconductor substrate 1, the nickel layer 22 and the molybdenum layer 21 are stacked sequentially in the order stated, an amount of molybdenum carbide (MoC) generated by a reaction between molybdenum atoms in the molybdenum layer 21 and surplus carbon atoms occurring at the heat treatment at step S6 described hereinafter increases and therefore, peeling of the contact electrode 3 as a consequence of surplus carbon atoms is effectively suppressed.

Figure 4:
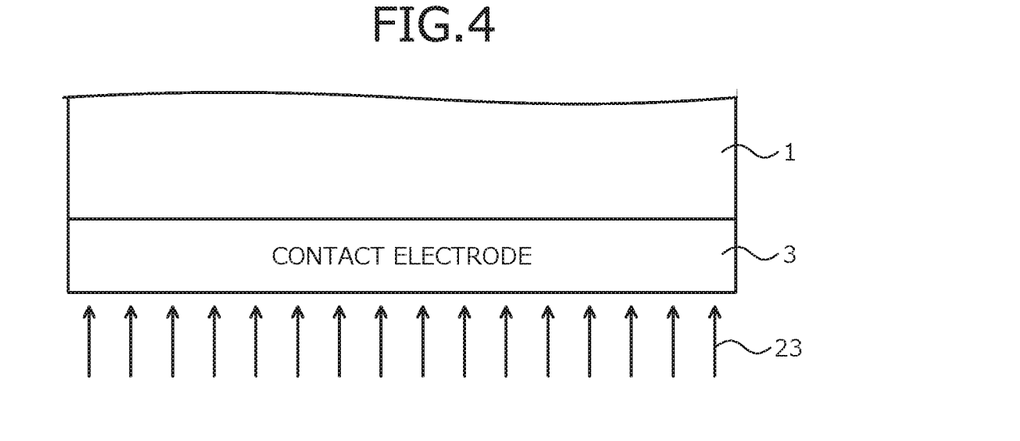
FIG. 4 is a cross-sectional view of the silicon carbide semiconductor device according to the embodiment during manufacture.

Next, as depicted in FIG. 4, a heat treatment for forming an ohmic contact with the semiconductor substrate 1 is performed, thereby reacting nickel atoms in the nickel layer 22 with silicon atoms in the semiconductor substrate 1 to form a silicide, whereby the contact electrode 3 is formed (step S6: second process). By the heat treatment at step S6, a nickel silicide containing a molybdenum carbide is formed as the contact electrode 3, and an ohmic contact between the contact electrode 3 and the semiconductor substrate 1 is formed.

The heat treatment at step S6, for example, may be a laser annealing 13 that enables local heating and the rear surface side of the semiconductor substrate 1 alone may be heated. As a result, the element structure of the front surface side of the semiconductor substrate 1 may be prevented from being adversely affected by a history of heating by the heat treatment at step S6. In this case, conditions of the laser annealing 13 may be set as, for example, a laser wavelength of about 355 nm and energy density of about 2.6 $J/cm^2$.

Figure 5:
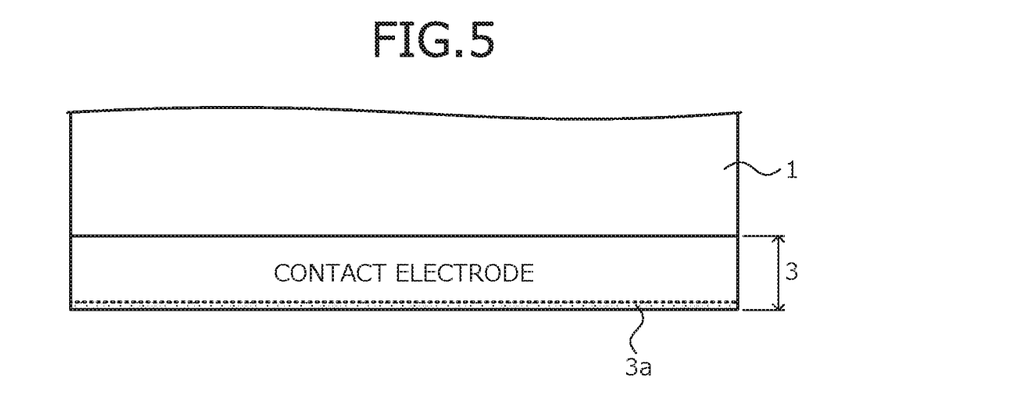
FIG. 5 is a cross-sectional view of the silicon carbide semiconductor device according to the embodiment during manufacture.

Further, as depicted in FIG. 5, the nickel layer 22 is converted into a silicide, whereby a carbon layer 3a (hatched portion) formed by the surplus carbon atoms occurring in the semiconductor substrate 1 is deposited at a surface (exposed surface) side of the contact electrode 3. In the contact electrode 3, remaining surplus carbon atoms that are not deposited as the carbon layer 3a on the surface of the contact electrode 3 may be present. When the heat treatment at step S6 is set as the laser annealing 13, the contact electrode 3 is formed by the molybdenum layer 21 and the nickel layer 22, whereby a deposited amount of the carbon layer 3a may be reduced as compared to a case in which the molybdenum layer 21 is replaced with a titanium layer.

Figure 6:
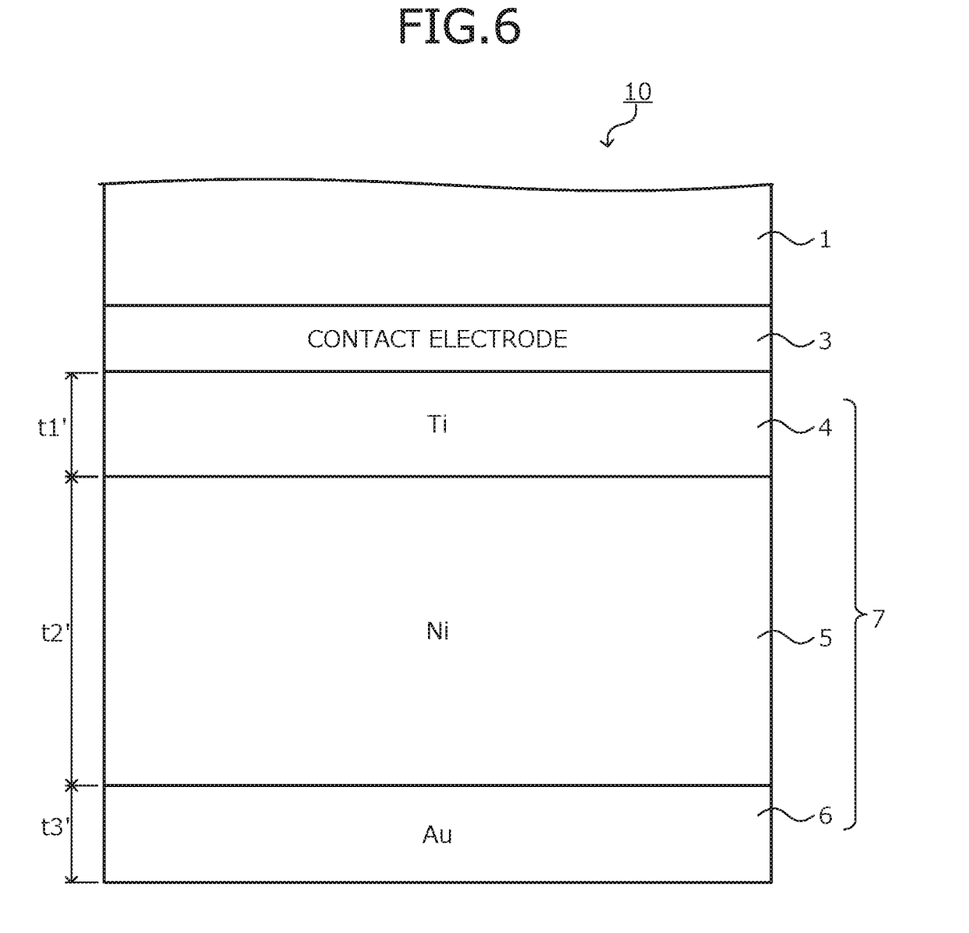
FIG. 6 is a cross-sectional view of the silicon carbide semiconductor device according to the embodiment during manufacture.

Next, as depicted in FIG. 6, the carbon layer 3a at the surface of the contact electrode 3 is removed (step S7). As a process at step S7, for example, reverse sputtering of causing collisions with ionized argon (Ar) to remove impurities or etching may be performed. After the process at step S6 and before the process at step S7, a cleaning process for removing a natural oxide film formed at the surface of the contact electrode 3 may be performed. The cleaning process may be, for example, a dilute hydrofluoric acid treatment.

Next, for example, by sputtering, the titanium (Ti) layer 4, the nickel (Ni) layer 5, and the gold (Au) layer 6 are sequentially formed at a surface (exposed surface) of the contact electrode 3 (steps S8 to S10: third process). As a result, the metal connection layer 7 in which the titanium layer 4, the nickel layer 5, and the gold layer 6 are sequentially stacked is formed, and the rear electrode 8 including the contact electrode 3 and the metal connection layer 7 is formed. During sputtering for forming (depositing) the titanium layer 4, the nickel layer 5, and the gold layer 6, a temperature of the semiconductor substrate 1 may be maintained in a range, for example, from about 150 degrees C. to 200 degrees C.

The initial thickness t1' of the titanium layer 4 may be in a range, for example, from 100 nm to ensure reliability, to about 300 nm to suppress brittleness and destruction of the titanium layer 4. The initial thickness t2' of the nickel layer 5 may be set to be thick enough that, after the assembly process described hereinafter, the nickel layer 5 remains to have the predetermined thickness t2 (refer to FIG. 1) and the initial thickness t2' may be, for example, in a range from about 1000 nm to 1500 nm. The initial thickness t3' of the gold layer 6 may be set to thin, for example, in a range from about 20 nm to 200 nm to suppress increases in cost.

In particular, when a trench gate MOSFET is fabricated as the silicon carbide semiconductor device 10 according to the embodiment, the initial thicknesses t1' to t3' of the titanium layer 4, the nickel layer 5, and the gold layer 6 may be thick enough to ensure reliability of the product after the assembly process and, for example, may be about 250 nm, about 1450 nm, and about 100 nm, respectively. Further, the initial thicknesses t1' to t3' of the titanium layer 4, the nickel layer 5, and the gold layer 6 may be set according to a size of surface roughness of the rear surface of the semiconductor substrate 1.

Next, the semiconductor substrate (semiconductor wafer) 1 is cut into individual chips, whereby the silicon carbide semiconductor device 10 according to the embodiment is completed. Next, the assembly process for mounting the cut semiconductor substrate (semiconductor chips) 1 on the base substrate 11 is performed. In the assembly process, after a solder is applied on the conductive plate of the base substrate 11 (step S11), the semiconductor substrate 1 is disposed on the solder with the rear surface side of the semiconductor substrate 1 facing the solder so that the metal connection layer 7 is in contact with the solder (step S12).

Next, by a heat treatment, the semiconductor substrate 1 is heated, thereby baking the solder between the metal connection layer 7 and the base substrate 11, whereby the metal connection layer 7 is soldered to the base substrate 11 via the solder layer 9 that is formed by a hardening of the solder (step S13). The heat treatment at step S13, for example, is performed at a temperature that is at least equal to a melting point of a low-temperature solder and less than 350 degrees C., which is lower than the temperature at which a polyimide that is a material of the passivation film discolors. By the heat treatment at step S13, the nickel atoms in the melted nickel layer 5 and the gold atoms in the melted gold layer 6 diffuse into the solder layer 9 and improve the adhesion between the metal connection layer 7 and the solder layer 9.

The nickel atoms in the nickel layer 5 and the gold atoms in the gold layer 6 diffuse into the solder layer 9 as a consequence of a history of heating (heat treatment at step S13, etc.) in the assembly process. As a result, the thicknesses t2, t3 of the nickel layer 5 and the gold layer 6 after the assembly process are thinner than the initial thicknesses t2', t3' at the time of formation (at the processes at steps S9, S10) of the nickel layer 5 and the gold layer 6. The thicknesses t2, t3 of the nickel layer 5 and the gold layer 6 after the assembly process may be as described above.

In the titanium layer 4, surplus carbon atoms that are in the contact electrode 3 diffuse as a consequence of a history of heating in processes at step S8 to S10. As a result, in the titanium layer 4, the carbon diffusion layer 4a that contains carbon at a high concentration is formed. Further, as a consequence of a history of heating in the assembly process thereafter, the thickness t4 of the carbon diffusion layer 4a that contains carbon at a high concentration increases. The carbon diffusion layer 4a that contains carbon at a high concentration does not easily melt in the solder layer 9. Therefore, in the assembly process, even when the titanium layer 4 is in contact with the solder layer 9 at regions where the nickel layer 5 and the gold layer 6 disappear, the thickness t1 of the titanium layer 4 is maintained at the thickness t1 that is substantially equal to the initial thickness t1' at the time of formation of the titanium layer 4.

By the processes above, the semiconductor substrate 1 having the fabricated silicon carbide semiconductor device 10 according to the embodiment is mounted on the base substrate 11, whereby the silicon carbide semiconductor assembly 12 according to the embodiment and depicted in FIG. 1 is completed, thus, ending the assembly process.

Figure 7:
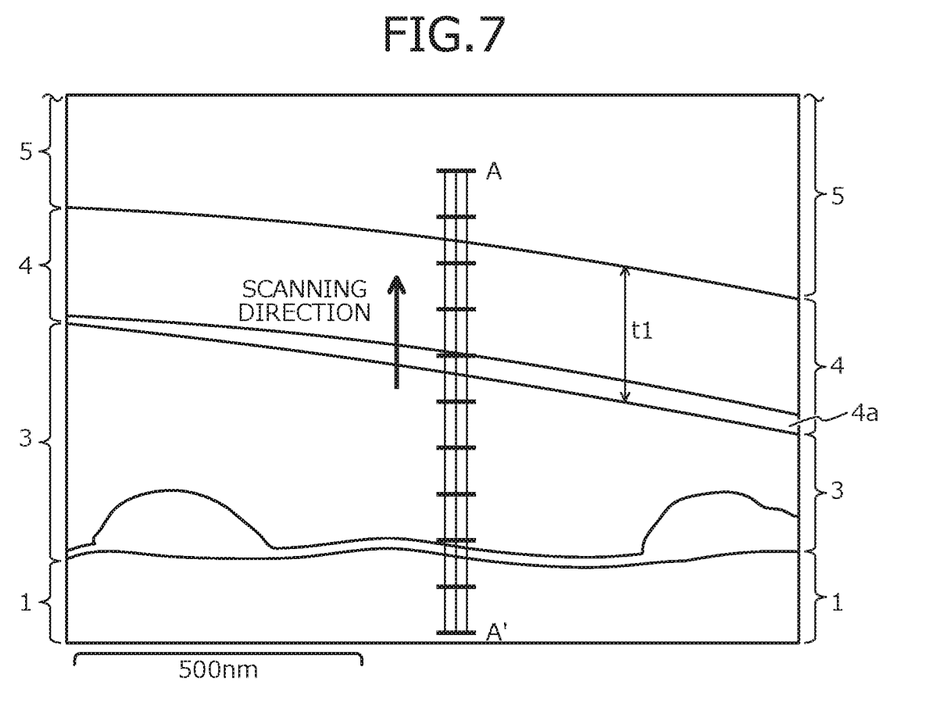
FIG. 7 is a schematic cross-sectional view of a metal connection layer of an example, as viewed under an electron microscope.
Figure 8:
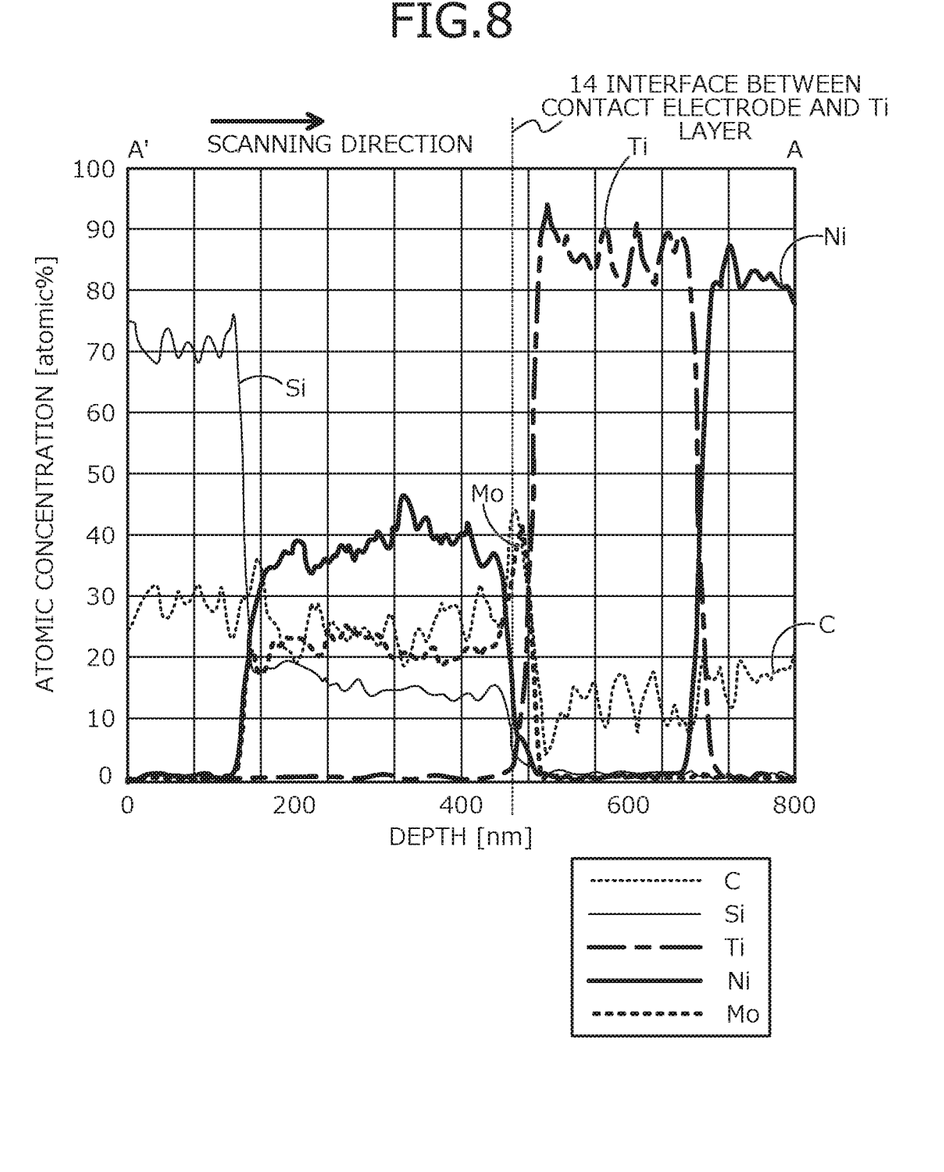
FIG. 8 is a distribution diagram of a composition along cutting line A-A' depicted in FIG. 7.

A composition of the titanium layer 4 was verified. FIG. 7 is a schematic cross-sectional view of a metal connection layer of an example, as viewed under an electron microscope. FIG. 7 schematically depicts a state of the metal connection layer 7 of the example, as viewed under a transmission electron microscope (TEM). FIG. 8 is a distribution diagram of a composition along cutting line A-A' depicted in FIG. 7. FIG. 8 depicts composition distribution near the interface 14 between the contact electrode 3 and the titanium layer 4 as measured by energy dispersive x-ray spectroscopy (EDS).

The processes at steps S1 to S13 described above are sequentially performed, thereby fabricating and mounting the silicon carbide semiconductor device 10 according to the embodiment to the base substrate 11, whereby the silicon carbide semiconductor assembly 12 according to the embodiment and depicted in FIG. 1 is fabricated (hereinafter, the example). Regarding the example, from a surface layer of the front surface of the semiconductor substrate 1 to a portion of the titanium layer 4 near the interface 14 between the titanium layer 4 and the contact electrode 3, states thereof as viewed under a TEM are depicted in FIG. 7.

Atomic concentrations [atomic percentages (atomic %'s)] of elements on a line along cutting line A-A' from near the front surface of the semiconductor substrate 1 toward the titanium layer 4 are depicted in FIG. 8. In FIG. 8, a left-portion of the interface 14 between the titanium layer 4 and the contact electrode 3 is the contact electrode 3 and the semiconductor substrate 1, from the interface 14; while a right-portion thereof is the titanium layer 4 and the nickel layer 5, from the interface 14. The metal connection layer 7 has the stacked structure in which sequentially from nearest the contact electrode 3, the titanium layer 4, the nickel layer 5, and the gold (Au) layer 6 are stacked.

From the results depicted in FIG. 8, in the example, molybdenum (Mo) atoms and carbon (C) atoms in the contact electrode 3 were confirmed to diffuse from the interface 14 between the titanium layer 4 and the contact electrode 3 to about 50 nm into the titanium layer 4. As depicted in FIG. 7, in a TEM image of the example, it was confirmed that in the titanium layer 4, along the interface 14 between the titanium layer 4 and the contact electrode 3, the carbon diffusion layer 4a that contains carbon at a high concentration is formed.

Further, from the results depicted in FIGS. 7 and 8, the thickness t1 of the titanium layer 4 was confirmed to be maintained substantially equal to the initial thickness t1' (refer to FIG. 6) at the time of formation (at the time of the process at step S8) of the titanium layer 4. A reason for this is that, as described above, when the metal connection layer 7 and the base substrate 11 are soldered together, even if the titanium layer 4 and the solder layer 9 are in contact with each other, diffusion of titanium atoms in the titanium layer 4 to the solder layer 9 is presumed to be stopped by the carbon diffusion layer 4a that is in the titanium layer 4 and that contains carbon at a high concentration.

While not depicted, it was confirmed that in the process at step S4, when a titanium layer is formed instead of the molybdenum layer 21, effects similar to those of the example are obtained.

As described above, according to the embodiment, the metal connection layer connecting the contact electrode and the solder layer has the stacked structure in which sequentially from nearest the contact electrode, the titanium layer, the nickel layer, and the gold layer are stacked. As a consequence of a history of heating when forming the metal connection layer, surplus carbon atoms in the contact electrode diffuse into the titanium layer that is lowest in the metal connection layer, whereby the carbon diffusion layer that contains carbon at a high concentration is formed in the titanium layer, along the interface between the titanium layer and the contact electrode. The carbon diffusion layer that includes carbon at a high concentration does not easily dissolve in solder. As a result, when the metal connection layer is soldered to the base substrate, even if the nickel layer and the gold layer that are on the titanium layer disappear, whereby the titanium layer and the solder layer are in contact with each other, diffusion of titanium atoms in the titanium layer is stopped by the carbon diffusion layer that contains carbon at a high concentration and thus, there is substantially no decrease in the concentration of the titanium atoms in the titanium layer after the assembly process.

In this manner, there is substantially no decrease in the concentration of titanium atoms in the titanium layer after the assembly process, whereby in the metal connection layer that connects the contact electrode and the solder layer, the thickness of the titanium layer that has high adhesion with the contact electrode may be maintained at substantially the initial thickness at the time when the titanium layer is formed. In addition, the nickel atoms in the nickel layer and the gold atoms in the gold layer above the titanium layer diffuse into the solder layer, whereby adhesion between the metal connection layer and the solder layer increases. As a result, since the adhesion between the contact electrode and the solder layer increases, even during long periods of driving under a high temperature and high humidity environment, a silicon carbide semiconductor device in which the contact electrode is resistant to peeling from the base substrate may be provided.

In the foregoing, the present invention is not limited to the embodiments above and various modifications within a range not departing from the spirit of the invention are possible. For example, dimensions, impurity concentrations, etc. of regions may be variously set according to required specifications.

According to the embodiments of the present invention, the thickness of the titanium layer that forms the metal connection layer that connects the contact electrode and the solder layer may be maintained at the initial thickness that is at the time when the titanium layer is formed, whereby the adhesion between the contact electrode and the metal connection layer may be increased. In addition, when the metal connection layer is solder to, for example, the base substrate, the nickel atoms in the nickel layer and the gold atoms in the gold layer that form the metal connection layer diffuse into the solder layer, whereby the adhesion between the metal connection layer and the solder layer increases.

The silicon carbide semiconductor device, the silicon carbide semiconductor assembly, and the method of manufacturing a silicon carbide semiconductor device according to the embodiments of the present invention achieve an effect in that the adhesion between the contact electrode and the solder layer may be enhanced.

As described, the silicon carbide semiconductor device, the silicon carbide semiconductor assembly, and the method of manufacturing a silicon carbide semiconductor device according to the present invention are useful for power semiconductors used in power converting equipment and power supply devices used in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a semiconductor substrate containing silicon carbide;
a contact electrode that is a nickel silicide layer containing molybdenum carbide, the contact electrode being provided on a surface of the semiconductor substrate and forming an ohmic contact with the semiconductor substrate; and
a metal connection layer provided on a surface of the contact electrode, wherein
the metal connection layer has a stacked structure in which on the surface of the contact electrode, a titanium layer, a nickel layer, and a gold layer are sequentially stacked,
the titanium layer includes a carbon diffusion layer formed along an interface between the titanium layer and the contact electrode, a concentration of each of carbon and molybdenum being higher in the carbon diffusion layer than in a portion of the titanium layer other than the carbon diffusion layer,
the titanium layer has a thickness that is in a range from 100 nm to 300 nm,
the nickel layer has a thickness that is in a range from 1000 nm to 1500 nm, and
the gold layer has a thickness that is in a range from 20 nm to 200 nm.

2. The silicon carbide semiconductor device according to claim 1, wherein
the carbon diffusion layer contains at least 20 atomic-percent of carbon and covers the entire interface between the titanium layer and the contact electrode.

3. A silicon carbide semiconductor assembly, comprising:
a silicon carbide semiconductor device, including
a semiconductor substrate containing silicon carbide,
a contact electrode that is a nickel silicide layer containing molybdenum carbide, the contact electrode being provided on a surface of the semiconductor substrate and forming an ohmic contact with the semiconductor substrate, and
a metal connection layer provided on a surface of the contact electrode; and
a base substrate on which the silicon carbide semiconductor device is mounted, the base substrate being in contact with the metal connection layer via a solder layer, wherein
the metal connection layer has a stacked structure in which on the surface of the contact electrode, a titanium layer, a nickel layer, and a gold layer are sequentially stacked,
the titanium layer includes a carbon diffusion layer formed along an interface between the titanium layer and the contact electrode, a concentration of each of carbon and molybdenum being higher in the carbon diffusion layer than in a portion of the titanium layer other than the carbon diffusion layer,
the titanium layer has a thickness that is in a range from 100 nm to 300 nm, and
the nickel layer has a thickness that is at least 50 nm.

4. A method of manufacturing a silicon carbide semiconductor device, the method comprising manufacturing the silicon carbide semiconductor device according to claim 1 including:
providing the semiconductor substrate containing silicon carbide;
forming, on the surface of the semiconductor substrate, a metal layer that contains nickel;
forming the contact electrode in contact with the semiconductor substrate, by applying heat treatment to the semiconductor substrate and the metal layer, thereby causing silicon atoms in the semiconductor substrate and nickel atoms in the metal layer to react, so as to form a nickel silicide layer containing molybdenum carbide that is the contact electrode; and forming on the surface of the contact electrode, the metal connection layer of the stacked structure, by sequentially stacking the titanium layer, the nickel layer, and the gold layer on the surface of the contact electrode, wherein the contact electrode has surplus carbon atoms and molybdenum atoms, which are diffused from the contact electrode into the titanium layer to form, in the titanium layer along the interface between the titanium layer and the contact electrode, the carbon diffusion layer.

5. The method according to claim 4, wherein forming the metal layer includes:

forming on the surface of the semiconductor substrate, a first metal layer containing a metal carbide, and forming on a surface of the first metal layer, a second metal layer containing nickel, and in forming the nickel silicide layer, metal atoms in the first metal layer and carbon atoms in the semiconductor substrate react with each other to form a carbide, and the silicon atoms in the semiconductor substrate and nickel atoms in second metal layer react with each other to form the nickel silicide layer.

6. The method according to claim 5, wherein the first metal layer contains molybdenum or titanium.

7. The silicon carbide semiconductor device according to claim 1, wherein a depth of the carbon diffusion layer is approximately 50 nm.

8. The silicon carbide semiconductor device according to claim 1, wherein the contact electrode is formed by stacking a molybdenum layer of 30-80 nm and another nickel layer of 80-120 nm.

9. The silicon carbide semiconductor device according to claim 1, wherein the contact electrode is formed by stacking a molybdenum layer and another nickel layer that is thicker than the molybdenum layer.

10. The silicon carbide semiconductor assembly according to claim 3, wherein a depth of the carbon diffusion layer is approximately 50 nm.

11. The silicon carbide semiconductor assembly according to claim 3, wherein the contact electrode is formed by stacking a molybdenum layer of 30-80 nm and another nickel layer of 80-120 nm.

12. The silicon carbide semiconductor assembly according to claim 3, wherein the contact electrode is formed by stacking a molybdenum layer and another nickel layer that is thicker than the molybdenum layer.

\* \* \* \* \*